(12) United States Patent
Li et al.

(10) Patent No.: US 10,616,997 B2
(45) Date of Patent: Apr. 7, 2020

(54) CIRCUIT BOARD STRUCTURE, BINDING TEST METHOD AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Kun Li, Beijing (CN); Tao Ma, Beijing (CN); Fengzhen Lv, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/558,412

(22) PCT Filed: Mar. 3, 2017

(86) PCT No.: PCT/CN2017/075531
§ 371 (c)(1),
(2) Date: Sep. 14, 2017

(87) PCT Pub. No.: WO2017/202098
PCT Pub. Date: Nov. 30, 2017

(65) Prior Publication Data
US 2019/0116662 A1 Apr. 18, 2019

(30) Foreign Application Priority Data
May 24, 2016 (CN) ..................... 2016 2 0505253 U

(51) Int. Cl.
*H05K 1/02* (2006.01)
*G02F 1/133* (2006.01)
(Continued)

(52) U.S. Cl.
CPC ......... *H05K 1/0268* (2013.01); *G01R 31/046* (2013.01); *G02F 1/133* (2013.01);
(Continued)

(58) Field of Classification Search
CPC ...... H05K 1/0268; H05K 3/361; H05K 1/144; H05K 1/028; H05K 2203/166;
(Continued)

(56) References Cited

U.S. PATENT DOCUMENTS

| 4,721,365 A * | 1/1988 | Nishimura | ............ G02F 1/1345 29/593 |
| 5,346,401 A * | 9/1994 | Delianides | ........... H01R 12/613 439/67 |

(Continued)

FOREIGN PATENT DOCUMENTS

| CN | 101287329 A | 10/2008 |
| CN | 101662895 A | 3/2010 |

(Continued)

OTHER PUBLICATIONS

International Search Report and Written Opinion for Application No. PCT/CN2017/075531, dated Jun. 7, 2017, 11 Pages.

*Primary Examiner* — Daniel R Miller
(74) *Attorney, Agent, or Firm* — Brooks Kushman P.C.

(57) ABSTRACT

A circuit board structure, a binding test method and a display device are provided. The circuit board structure includes a first circuit board including a first binding region, a second circuit board including a second binding region matching with the first binding region, and a test circuit configured to test an alignment state of the first circuit board and the second circuit board. The test circuit includes multiple first electrodes and multiple second electrodes insulated from each other and arranged on the first circuit board, and multiple third electrodes arranged on the second circuit
(Continued)

board. A group including one of the first electrodes and one of the second electrodes matches with one of the third electrodes, so that a current flows through the test circuit in case that the test circuit is supplied with power.

17 Claims, 2 Drawing Sheets

(51) Int. Cl.
    *H05K 3/36*     (2006.01)
    *G01R 31/04*     (2006.01)
    *G02F 1/13*     (2006.01)
    *H05K 1/14*     (2006.01)
    *H05K 1/18*     (2006.01)
    *H05K 1/11*     (2006.01)

(52) U.S. Cl.
    CPC ........... *G02F 1/1309* (2013.01); *H05K 1/028* (2013.01); *H05K 1/144* (2013.01); *H05K 3/361* (2013.01); *H05K 1/117* (2013.01); *H05K 1/118* (2013.01); *H05K 1/189* (2013.01); *H05K 2201/041* (2013.01); *H05K 2201/09381* (2013.01); *H05K 2201/09936* (2013.01); *H05K 2201/10136* (2013.01); *H05K 2203/166* (2013.01)

(58) Field of Classification Search
    CPC ........ H05K 1/189; H05K 1/118; H05K 1/117; H05K 2201/09936; H05K 2201/10136; H05K 2201/041; H05K 2201/09381; G02F 1/1309; G02F 1/133; G01R 31/046
    See application file for complete search history.

(56) References Cited

U.S. PATENT DOCUMENTS

| | | | | |
|---|---|---|---|---|
| 5,705,855 | A * | 1/1998 | Carson | .............. H01L 24/10 |
| | | | | 257/668 |
| 6,474,132 | B1 * | 11/2002 | Hathaway | ............. G01F 1/08 |
| | | | | 702/100 |
| 2008/0253074 | A1 | 10/2008 | Shie | |
| 2017/0184902 | A1 | 6/2017 | Xu et al. | |

FOREIGN PATENT DOCUMENTS

| | | | | |
|---|---|---|---|---|
| CN | 104375296 A | 2/2015 | | |
| CN | 204669721 U | 9/2015 | | |
| CN | 205642942 U | 10/2016 | | |
| EP | 0493240 A2 * | 7/1992 | ......... | G02F 1/13452 |
| JP | 2002050845 A | 2/2002 | | |

* cited by examiner

CIRCUIT BOARD STRUCTURE, BINDING TEST METHOD AND DISPLAY DEVICE

CROSS-REFERENCE TO RELATED APPLICATIONS

This application is the U.S. national phase of PCT Application No. PCT/CN2017/075531 filed on Mar. 3, 2017, which claims priority to Chinese Patent Application No. 201620505253.9 filed on May 24, 2016, which are incorporated herein by reference in their entireties.

TECHNICAL FIELD

The present disclosure relates to the field of display technology, and in particular to a circuit board structure, a binding test method and a display device.

BACKGROUND

A bonding operation is a commonly-used process in manufacturing a Thin Film Transistor Liquid Crystal Display (TFT-LCD) module, and mainly refers to assembling a panel and a Flexible Printed Circuit (FPC) together or assembling the FPC and a Printed Circuit Board (PCB) together by means of an Anisotropic Conductive Adhesive (ACF) according to a certain workflow and enabling them to be electrically connected with each other.

However, a state of the bonding is mainly confirmed through viewing by a microscope. This viewing is complex and inefficient, resulting in a low yield. Since a substrate of a LCD panel currently is transparent, the state of the binding between the FPC and the panel may be viewed through the microscope. However, in case that a non-transparent PCB is used, it is a problem how to detect the state of the binding between the FPC and the non-transparent PCB.

SUMMARY

A main objective of the present disclosure is to provide a technical solution capable of detecting a binding state between circuit boards and improving work efficiency.

In order to achieve the above objective, in one example aspect, a circuit board structure is provided in embodiments of the present disclosure. The circuit board structure includes a first circuit board including a first binding region, a second circuit board including a second binding region matching with the first binding region, and a test circuit configured to test an alignment state of the first circuit board and the second circuit board and including a plurality of first electrodes, a plurality of second electrodes and a plurality of third electrodes, wherein the plurality of first electrodes and the plurality of second electrodes are insulated from each other and arranged on the first circuit board, and the plurality of third electrodes are arranged on the second circuit board, wherein a group including one first electrode of the plurality of first electrodes and one second electrode of the plurality of second electrodes matches with one of the plurality of third electrodes, so that a current flows through the test circuit in case that the test circuit is supplied with power.

Optionally, the first binding region includes a plurality of first connection sheets and the second binding region includes a plurality of second connection sheets, and the number and an arrangement of the plurality of first connection sheets are identical to those of the plurality of second connection sheets. In case that the first binding region matches with the second binding region successfully, each of the plurality of first connection sheets is attached to a corresponding one of the plurality of second connection sheets.

Optionally, each of the number of the plurality of first electrodes, the number of the plurality of second electrodes and the number of the plurality of third electrodes is equal to 2.

Optionally, both the plurality of first electrodes and the plurality of second electrodes are arranged at both sides of the first binding region, and the plurality of third electrodes are arranged at both sides of the second binding region.

Optionally, the plurality of second electrodes are arranged at both sides of the whole of the plurality of first electrodes.

Optionally, the plurality of first electrodes and the plurality of second electrodes are all stripe-like conductors.

Optionally, each of the plurality of third electrodes is a U-shape conductor.

Optionally, the test circuit further includes a plurality of first test points and a plurality of second test points, wherein each of the plurality of first test points is connected to a corresponding one of the plurality of first electrodes and each of the plurality of second test points is connected to a corresponding one of the plurality of second electrodes.

Optionally, in the group including one first electrode of the plurality of first electrodes and one second electrode of the plurality of second electrodes, the one first electrode and the one second electrode are separated from each other and are electrically connected to a corresponding third electrode of the plurality of third electrodes that matches with the group.

Optionally, the first circuit board further includes a plurality of first alignment regions, the second circuit board further includes a plurality of second alignment regions, and in case that a binding between the first circuit board and the second circuit board is successful, the plurality of first alignment regions are completely aligned with the plurality of second alignment regions.

Optionally, the plurality of first electrodes and the plurality of second electrodes are arranged between the plurality of first alignment regions and the first binding region, and the plurality of third electrodes are arranged between the plurality of second alignment regions and the second binding region.

Optionally, the first circuit board is a printed circuit board and the second circuit board is a flexible circuit board, or both the first circuit board and the second circuit board are printed circuit boards, or both the first circuit board and the second circuit board are flexible circuit boards.

Optionally, a first alignment region and a second alignment region matching with the first alignment region are arranged on the first circuit board and the second circuit board respectively.

In another example aspect, a display device is provided and the display device includes the above circuit board structure.

In another example aspect, a binding test method for the above circuit board is provided. The binding test method includes: supplying power to the group comprising one first electrode of the plurality of first electrodes and one second electrode of the plurality of second electrodes; and determining whether a current flowing through the group is within a predetermined current range or not.

Optionally, the method further includes: determining, in case that the current flowing through the group is zero or significantly smaller than a predetermined current value, that a binding between the first circuit board and the second circuit board is not successful, and determining, in case that the current flowing through the group is within a predetermined current range, that the binding between the first circuit board and the second circuit board is successful.

Optionally, the test circuit further includes a plurality of first test points and a plurality of second test points, and each of the plurality of first test points is connected to a corresponding one of the plurality of first electrodes, and each of the plurality of second test points is connected to a corresponding one of the plurality of second electrodes, and the group comprising one first electrode of the plurality of first electrodes and one second electrode of the plurality of second electrodes is supplied with power though one of the plurality of first test points corresponding to the one first electrode and one of the plurality of second test points corresponding to the one second electrode.

As compared with relevant circuit board structure, the binding state between a non-transparent PCB and an FPC may be determined by means of the circuit board structure and the display device provided in the embodiments of the present disclosure due to the circuit board structure being supplied with power, and thus the problem that the binding state may not be observed through viewing by a microscope is solved. The binding test method provided in the present disclosure is more efficient and a binding test efficiency during manufacturing the TFT-LCD module may be increased.

DETAILED DESCRIPTION

Figure 1:
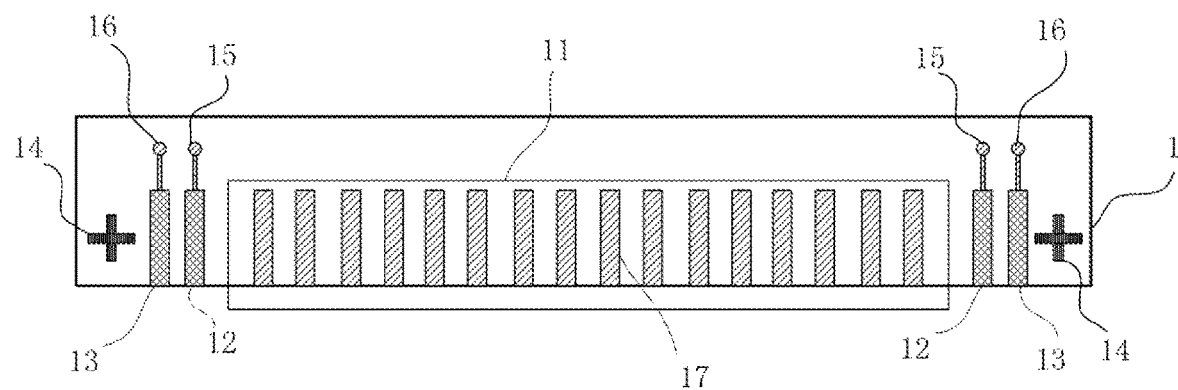
FIG. 1 is a schematic view showing a first circuit board according to embodiments of the present disclosure.

Embodiments of the present disclosure will be described hereinafter in a clear and complete manner in conjunction with drawings of the present disclosure. Obviously, the described embodiments are merely a part, rather than all, of the embodiments of the present disclosure. Based on these embodiments, a person of ordinary skills in the art may obtain other embodiments without any creative effort, and these other embodiments fall within the scope of the present disclosure.

The present disclosure provides in some embodiments a circuit board structure including a first circuit board, a second circuit board and a test circuit. The test circuit is configured to test an alignment state of the first circuit board and the second circuit board, and includes a plurality of first electrodes, a plurality of second electrodes and a plurality of third electrodes. The plurality of first electrodes and the plurality of second electrodes are insulated from each other and are arranged on the first circuit board. The plurality of third electrodes are arranged on the second circuit board. The first circuit board includes a first binding region, and the second circuit board includes a second binding region matching with the first binding region. A group including one of the plurality of first electrodes and one of the plurality of second electrodes matches with one of the plurality of third electrodes, so that a current may flow through the test circuit in case that the test circuit is supplied with power.

In order to bind two circuit boards to be bound in a relevant circuit board structure successfully, binding regions of the two circuit boards need to be matched with each other completely. Currently, when detecting a binding state of two transparent circuit boards, an operator may directly use a microscope to view and directly determine, by viewing, whether or not the binding regions of the two circuit boards are misaligned with each other. The misalignment means that the binding between the two circuit boards is failed, and no misalignment means that the binding between the two circuit boards is successful. However, there is no method for detecting the binding state of non-transparent circuit boards.

In this regard, a test circuit is specifically provided in the circuit board structure in the embodiments of the present disclosure so as to determine whether the binding between the two circuit boards is successful or not. The plurality of first electrodes and the plurality of second electrodes insulated from each other (i.e., electrically disconnected from each other) may be arranged on the first circuit board, and the plurality of third electrodes may be arranged on the second circuit board. Since the group including one of the plurality of first electrodes and one of the plurality of the second electrodes completely matches with a corresponding one of the plurality of third electrodes in case that the binding between the first circuit board and the second circuit board is successful (i.e., there is no misalignment), a current may flow through the first electrode, the second electrode and the third electrode to form an electrically-conductive path in a state of the circuit board structure being supplied with power. In case that a voltage used during test is configured to have a standard value, a magnitude of a current flowing through the first, the second, and the third electrodes is in a predetermined range in case of correct alignment because a value of a resistance formed after the first, the second and the third electrodes are in contact with each other may depend on the alignment state of the first, the second and the third electrodes. In case of misalignment, no current may flow through the electrodes or the current may be significantly smaller than a predetermined value. By additionally providing the test circuit on the circuit board, whether or not the two circuit boards are aligned with each other (i.e., bound to each other) successfully may be determined.

The first binding region in optional embodiments of the present disclosure includes a plurality of first connection sheets, and the second binding region includes a plurality of second connection sheets. An arrangement and the number of the plurality of first connection sheets are identical to those of the plurality of second connection sheets. In case that the binding between the first binding region and the second binding region is successful, each of the plurality of first connection sheets is attached to a corresponding one of the plurality of second connection sheets.

In other words, in order to form the circuit board structure, the connection sheets are provided in the two binding regions on the two circuit boards to be bound, respectively and are used for data transmission, i.e., data exchange needs to be performed between each of the first connection sheets and the corresponding one of the second connection sheets. Hence, each of the first connection sheets needs to be designed to match with the corresponding one of the second connection sheets so as to bind the two circuit boards successfully. The successful binding mainly depends on the correct alignment between the two circuit boards, and due to a characteristic of a binding process, the attachment between the first connection sheets and the second connection sheets is satisfactory as long as there is no misalignment between the first connection sheets and the second connection sheets.

It should be noted that the first connection sheets, the second connection sheets, the first electrodes, the second electrodes and the third electrodes may all be made of metal, e.g., copper (Cu), in actual applications.

In the embodiments of the present disclosure, the number of the plurality of first electrodes, the number of the plurality of second electrodes and the number of the plurality of third electrodes may all be equal to 2, and the plurality of first electrodes and the plurality of second electrodes may be arranged at both sides of the first binding region, and the plurality of third electrodes may be arranged at both sides of the second binding region. In other words, one of the plurality of first electrodes and one of the plurality of second electrodes may be grouped into a first group, and another one of the first electrodes and another one of the second electrodes may be grouped into a second group. For example, in actual applications, the first group may be arranged at a left side of the first binding region on the first circuit board, the second group may be arranged at a right side of the first binding region on the first circuit board, and a position relationship between the one of the first electrodes and the one of the second electrodes in the first group is reverse to that between the another of the first electrodes and the another of the second electrodes in the second group. For example, the first electrode in the first group is located at a left side of the second electrode, and the first electrode in the second group is located at a right side of the second electrode; or the first electrode in the first group is located at a right side of the second electrode, and the first electrode in the second group is located at a left side of the second electrode. Correspondingly, one of the third electrodes on the second circuit board may be arranged at a left side of the second binding region, and another one of the third electrodes may be arranged at a right side of the second binding region.

The two groups formed of the first electrodes and the second electrodes are arranged at two ends of the first circuit board and the two third electrodes matching with the two groups are arranged at two ends of the second circuit board, and whether the binding is successful or not depends mainly on whether the misalignment occurs or not. As a result, such arrangements of the first circuit board and the second circuit board may increase the detection accuracy for the misalignment, thereby further determining the binding state conveniently.

Of course, the above-mentioned arrangements are merely optional arrangements. In order to improve the detection accuracy in actual applications, similar test regions may also be provided at the binding regions, and the number of the testing regions may be one, three or more, which are not particularly defined herein.

In the embodiments of the present disclosure, each of the first electrodes and the second electrodes may be a stripe-like conductor, and the third electrode may be a U-shape conductor correspondingly. Of course, shapes of the first electrodes, the second electrodes and the third electrodes may be various, which are not particularly defined herein. The electrically-conductive path may be formed among the first, the second and the third electrodes in a bound and attached state, as long as each of the first electrodes are insulated from each of the second electrodes and each of the third electrodes is an integral piece.

Further, the test circuit may further include a plurality of first test points connected to the plurality of first electrodes and a plurality of second test points connected to the plurality of second electrodes. The first test points and the second test points may facilitate the test. For example, a plurality of test probes may be used to be in direct contact with the first test points and the second test points, and in case that there is a current flowing into the first test points and flowing out of the second test points, it may be determined that the first electrodes and the second electrodes are electrically connected to the third electrodes.

In actual applications, the first, second and third electrodes may be newly-added electrodes, or electrodes acquired by improving designs of relevant electrodes. The improved designs of relevant electrodes may be implemented because there are probably some dummy connection sheets not used for the data transmission within or outside the binding regions of the circuit boards (shapes and materials of these dummy connection sheets are identical to those of the first connection sheets and the second connection sheets). In case of existence of these dummy connection sheets, the shapes of these dummy connection sheets may be changed so as to acquire the first, second and third electrodes. For example, two of the dummy connection sheets on the first circuit board may be used as the first electrode and the second electrode, respectively, and bottoms of two of the dummy connection sheets on the second circuit board may be connected to form the third electrode having a U-shape.

In actual applications, a shape of each of the test points may be circular, semi-circular, rectangular, or triangular, which is not particularly defined herein.

In the embodiments of the present disclosure, in order to facilitate the alignment of the first circuit board with the second circuit board during binding the first circuit board and the second circuit board, marks may further be arranged on the two circuit boards. In other words, the first circuit board may further include a plurality of first alignment regions, and the second circuit board may further include a plurality of second alignment regions matching with the plurality of first alignment regions. In case that the binding between the first circuit board and the second circuit board is successful, the plurality of first alignment regions may be aligned with the plurality of second alignment regions.

In the embodiments of the present disclosure, the plurality of first electrodes and the plurality of second electrodes may be arranged between the plurality of first alignment regions and the first binding region, and the plurality of third electrodes may be arranged between the plurality of second alignment regions and the second binding region.

Of course, in actual applications, any further improvement having equivalent effects may be performed in accordance with practical needs, which is not particularly defined herein.

Figure 2:
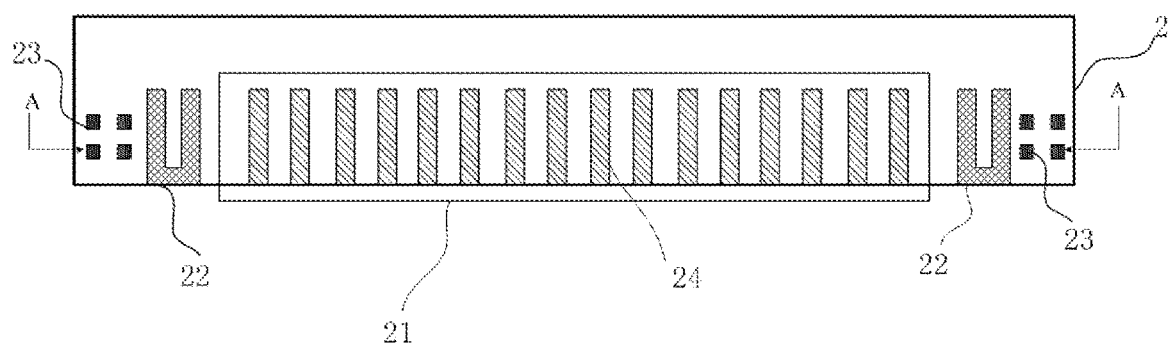
FIG. 2 is a schematic view showing a second circuit board according to embodiments of the present disclosure.
Figure 3:
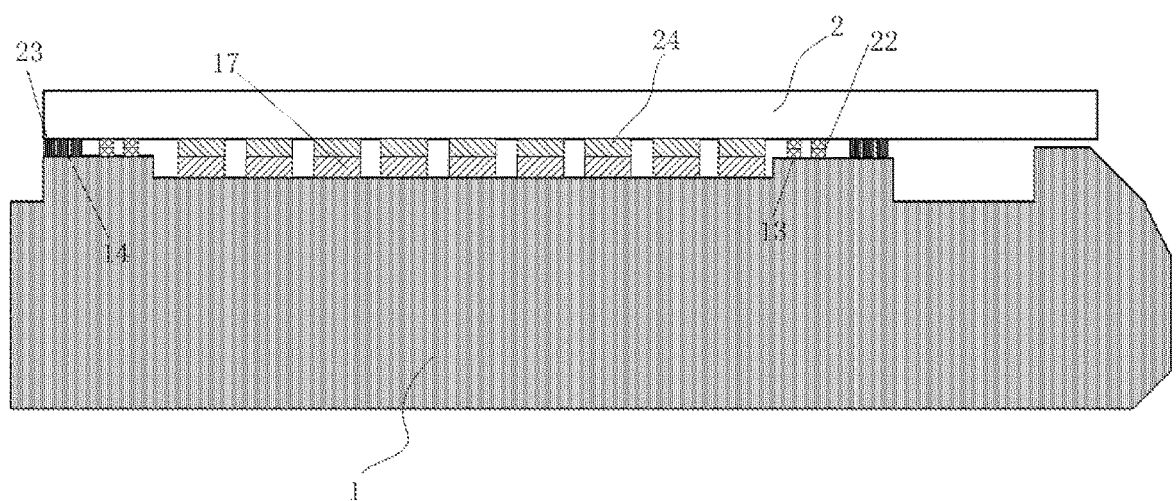
FIG. 3 is a sectional view of the first circuit board and the second circuit board taken along a line A-A in FIG. 2 after an alignment therebetween and before press-fitting the circuit boards.

For convenience of understanding, FIG. 1 to FIG. 3 are provided. FIG. 1 is a structural schematic view of the first circuit board provided in the embodiments of the present disclosure; FIG. 2 is a structural schematic view of the second circuit board provided in the embodiments of the present disclosure; and FIG. 3 is a sectional view of the first circuit board and the second circuit board taken along a line A-A in FIG. 2 after an alignment therebetween and before press-fitting the circuit boards.

In the embodiments of the present disclosure, the first circuit board may be a Printed Circuit Board (PCB), and the second circuit board may be a Flexible Printed Circuit (FPC). Because the PCB is non-transparent and the FPC is transparent or semi-transparent, the above-mentioned circuit board structure is applicable to binding between the PCB and the FPC. However, it should be understood that, although the first circuit board is described with respect to the PCB and the second circuit board is described with respect to the FPC in the embodiments of the present disclosure, the above-mentioned circuit board structure may also be used to test the binding between two non-transparent circuit boards (e.g., two PCBs), or two transparent circuit boards (e.g., two FPCs).

In FIG. 1 and FIG. 2, a binding region 11 (i.e., the first binding region), two first electrodes 12, two second electrodes 13, two alignment regions 14 (i.e., the first alignment regions), two first test points 15 and two second test points 16 are arranged on the first circuit board 1 (e.g., the PCB). The binding region 11 is arranged in the middle of first circuit board 1. The two first electrodes 12 and the two second electrodes 13 are stripe-like electrodes, and the two first electrodes 12 are arranged at both sides of the first binding region 11, and the two second electrodes 13 are arranged at sides of the two first electrodes 12 away from the first binding region 11. The two first alignment regions 14 are arranged at sides of the two second electrodes 13 away from the first electrodes 12. A binding region (i.e., the second binding region) 21, two third electrodes 22 and two alignment regions (i.e., two second alignment regions) 23 are arranged on the second circuit board (such as the FPC) 2. The second binding region 21 is arranged in the middle of second circuit board 2. The two third electrodes 22 are U-shape electrodes and located at both sides of the second binding region, respectively. When detecting the binding state, the first circuit board 1 and the second circuit board 2 may be aligned with each other through the first alignment regions and the second alignment regions and then pressed-fitted with each other. At this time, power may be supplied to the first electrodes 12, the second electrodes 13 and the third electrodes 22 through the test points (i.e., the first test points 15 and the second test points 16). In case that these electrodes are electrically connected to each other, it means that there is no misalignment between all of the first connection sheets in the first binding region and the corresponding second connection sheets in the second binding region. Usually, no defect may occur during the press-fitting. Thus, in case of no misalignment, the binding between the first circuit board 1 and the second circuit board 2 is successful. FIG. 3 shows a state in which the binding between the first circuit board 1 and the second circuit board 2 is successful. In FIG. 3, the first connection sheets 17 of the first circuit board 1 (e.g., the PCB) completely match with the second connection sheets 24 of the second circuit board 2 (e.g., the FPC) in the successful binding state, i.e., there is no misalignment between the first connection sheets 17 and the second connection sheets 24.

Figure 4:
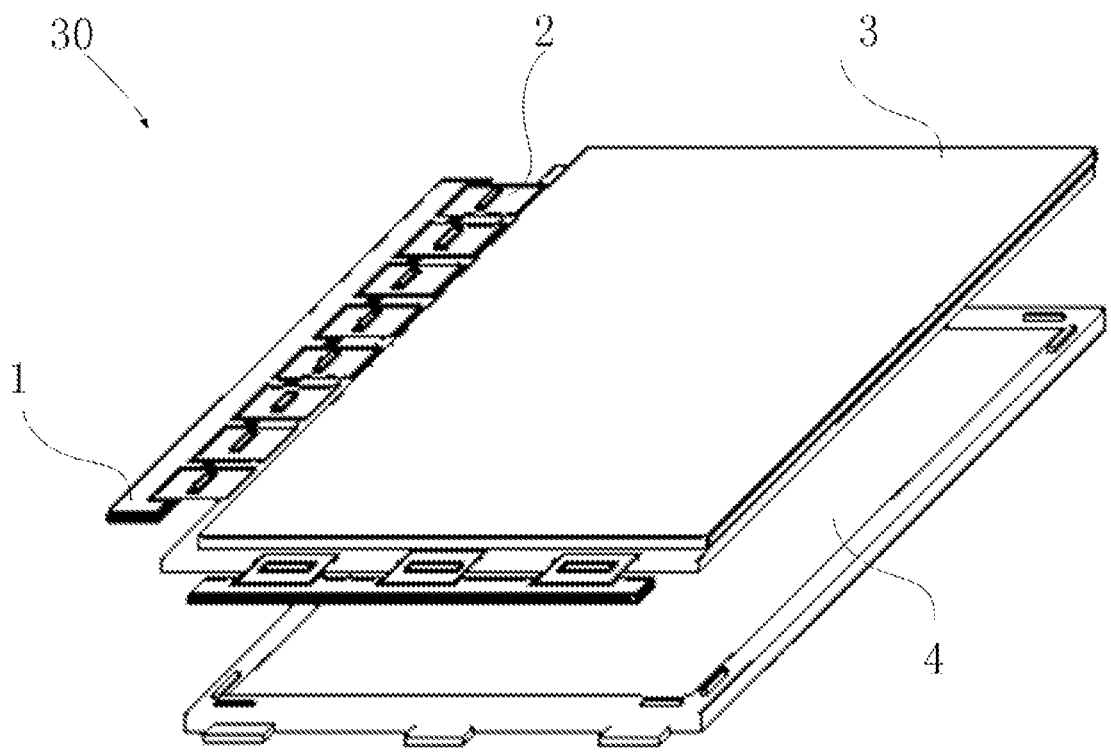
FIG. 4 is a schematic view of a assembled display device after the circuit boards are bound together according to embodiments of the present disclosure.

The present disclosure further provides a display device 30 including the above-mentioned circuit board structure described in the above embodiments of the present disclosure. Detailed description to a specific structure of the display device 30 may be obtained based on the detailed description to the above circuit board circuit and is not described again. For convenience of understanding, FIG. 4 shows a schematic diagram of the display device 30 after the circuit boards are bounded together in the embodiments of the present disclosure. It should be understood that, the first circuit board 1 and the second circuit board 2 in the display device 30 in the embodiments of the present disclosure may be a non-transparent PCB and a transparent FPC, respectively, or two non-transparent circuit boards, or two transparent circuit boards. In the embodiments of the present disclosure, in case that the circuit board structure includes the non-transparent PCB and the transparent FPC, the binding state between the PCB and the FPC may be tested in a much more efficient manner, and thereby the PCB, the FPC, a liquid crystal panel 3 and a backlight source 4 are assembled into a liquid crystal display module in a more efficient manner, and the display device has a satisfactory binding between the circuit boards.

Figure 5:
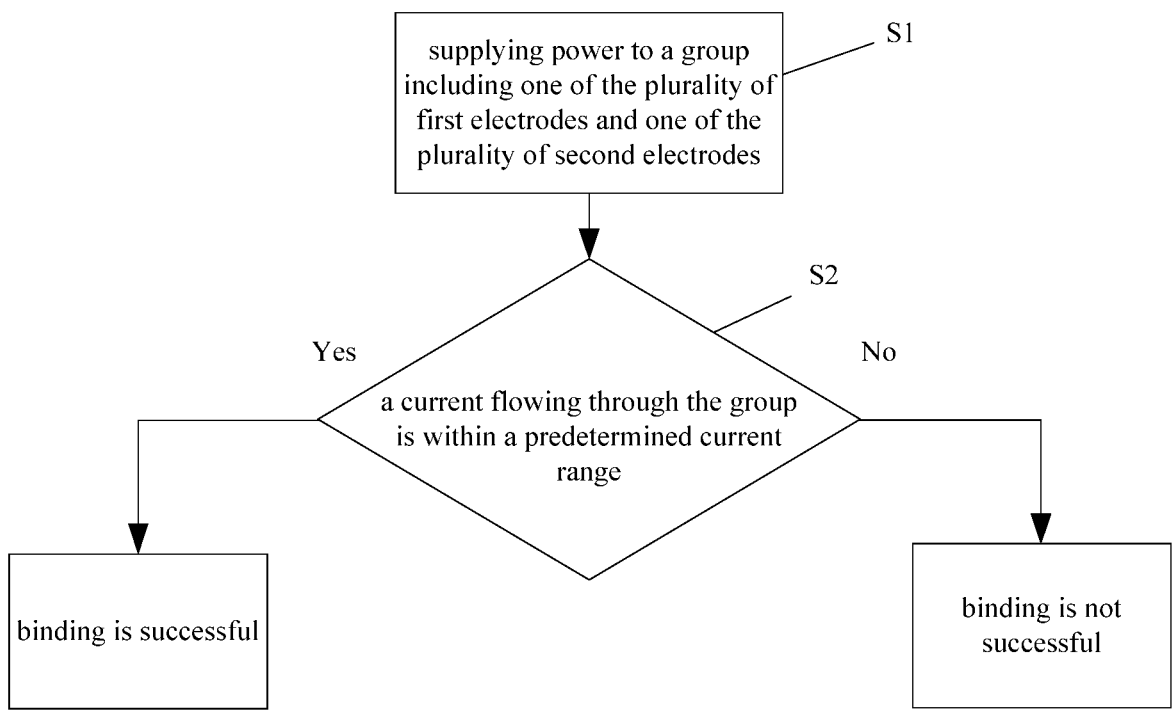
FIG. 5 is a flow chart of a binding test method according to embodiments of the present disclosure.

FIG. 5 is a flowchart of a binding test method provided in the embodiments of the present disclosure. The method shown in FIG. 5 is used for the above-mentioned circuit board structure in the embodiments of the present disclosure and includes Steps S1 and S2.

Step S1: supplying power to a group including one of the plurality of first electrodes and one of the plurality of second electrodes.

Step S2: determining whether a current flowing through the group is within a predetermined current range or not, wherein in case that the current flowing through the group is zero or significantly smaller than a predetermined value, the circuit board is determined to not be bound successfully, and in case that the current flowing through the group is within the predetermined current range, the circuit board structure is determined to be bound successfully.

The embodiments of the present disclosure determine the binding state between the non-transparent PCB and the transparent FPC bound together, by supplying power to the bound non-transparent PCT and the transparent FPC, and a relevant problem that the binding state between the non-transparent PCB and the transparent FPC may not be observed through viewing by a microscope is solved, and thereby an accuracy and an efficiency of testing the binding state between circuit boards may be improved.

The above are merely optional embodiments of the present disclosure. It should be noted that a person of ordinary skills in the art may make various modifications and improvements without departing from the spirit of the present disclosure, and these modifications and improvements shall also fall within the scope of the present disclosure.

What is claimed is:

1. A circuit board structure, comprising:
   a first circuit board comprising a first binding region;
   a second circuit board comprising a second binding region matching with the first binding region; and
   a test circuit configured to test an alignment state of the first circuit board and the second circuit board and comprising a plurality of first electrodes, a plurality of second electrodes and a plurality of third electrodes, the plurality of first electrodes and the plurality of second electrodes being insulated from each other and arranged on the first circuit board, and the plurality of third electrodes being arranged on the second circuit board,
   wherein a group comprising one first electrode of the plurality of first electrodes and one second electrode of the plurality of second electrodes matches with one of the plurality of third electrodes, so that a current flows through the test circuit in case that the test circuit is supplied with power;
   wherein the first circuit board further comprises a plurality of first alignment regions, the second circuit board further comprises a plurality of second alignment regions, and in case that a binding between the first circuit board and the second circuit board is successful, the plurality of first alignment regions are completely aligned with the plurality of second alignment regions.

2. The circuit board structure according to claim 1, wherein the first binding region comprises a plurality of first connection sheets and the second binding region comprises a plurality of second connection sheets, and the number and an arrangement of the plurality of first connection sheets are identical to those of the plurality of second connection sheets;

in case that the first binding region matches with the second binding region successfully, each of the plurality of first connection sheets is attached to a corresponding one of the plurality of second connection sheets.

3. The circuit board structure according to claim 1, wherein each of the number of the plurality of first electrodes, the number of the plurality of second electrodes and the number of the plurality of third electrodes is equal to 2.

4. The circuit board structure according to claim 3, wherein both the plurality of first electrodes and the plurality of second electrodes are arranged at both sides of the first binding region, and the plurality of third electrodes are arranged at both sides of the second binding region.

5. The circuit board structure according to claim 4, wherein the plurality of second electrodes are arranged at both sides of the whole of the plurality of first electrodes.

6. The circuit board structure according to claim 1, wherein the plurality of first electrodes and the plurality of second electrodes are all stripe-like conductors.

7. The circuit board structure according to claim 6, wherein each of the plurality of third electrodes is a U-shape conductor.

8. The circuit board structure according to claim 6, wherein the test circuit further comprises a plurality of first test points and a plurality of second test points, wherein each of the plurality of first test points is connected to a corresponding one of the plurality of first electrodes and each of the plurality of second test points is connected to a corresponding one of the plurality of second electrodes.

9. The circuit board structure according to claim 6, wherein in the group comprising one first electrode of the plurality of first electrodes and one second electrode of the plurality of second electrodes, the one first electrode and the one second electrode are separated from each other and are electrically connected to a corresponding third electrode of the plurality of third electrodes that matches with the group.

10. The circuit board structure according to claim 1, wherein the plurality of first electrodes and the plurality of second electrodes are arranged between the plurality of first alignment regions and the first binding region, and the plurality of third electrodes are arranged between the plurality of second alignment regions and the second binding region.

11. The circuit board structure according to claim 1, wherein the first circuit board is a printed circuit board and the second circuit board is a flexible circuit board, or both the first circuit board and the second circuit board are printed circuit boards, or both the first circuit board and the second circuit board are flexible circuit boards.

12. A display device, comprising:
the circuit board structure according to claim 1.

13. A binding test method for the circuit board structure according to claim 1, comprising:
supplying power to the group comprising one first electrode of the plurality of first electrodes and one second electrode of the plurality of second electrodes; and
determining whether a current flowing through the group is within a predetermined current range or not.

14. The binding test method according to claim 13, further comprising:
determining, in case that the current flowing through the group is zero or significantly smaller than a predetermined current value, that a binding between the first circuit board and the second circuit board is not successful, and
determining, in case that the current flowing through the group is within a predetermined current range, that the binding between the first circuit board and the second circuit board is successful.

15. The binding test method according to claim 13, wherein the test circuit further comprises a plurality of first test points and a plurality of second test points, and each of the plurality of first test points is connected to a corresponding one of the plurality of first electrodes, and each of the plurality of second test points is connected to a corresponding one of the plurality of second electrodes, and the group comprising one first electrode of the plurality of first electrodes and one second electrode of the plurality of second electrodes is supplied with power though one of the plurality of first test points corresponding to the one first electrode and one of the plurality of second test points corresponding to the one second electrode.

16. The circuit board structure according to claim 7, wherein the test circuit further comprises a plurality of first test points and a plurality of second test points, wherein each of the plurality of first test points is connected to a corresponding one of the plurality of first electrodes and each of the plurality of second test points is connected to a corresponding one of the plurality of second electrodes.

17. The circuit board structure according to claim 7, wherein in the group comprising one first electrode of the plurality of first electrodes and one second electrode of the plurality of second electrodes, the one first electrode and the one second electrode are separated from each other and are electrically connected to a corresponding third electrode of the plurality of third electrodes that matches with the group.

* * * * *